(12) United States Patent
Kawai

(10) Patent No.: US 6,933,775 B2
(45) Date of Patent: Aug. 23, 2005

(54) CIRCUIT FOR DETECTING AND CORRECTING CENTRAL LEVEL OF FSK DEMODULATION SIGNAL

(75) Inventor: Kazuo Kawai, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 64 days.

(21) Appl. No.: 10/357,702

(22) Filed: Feb. 4, 2003

(65) Prior Publication Data

US 2003/0151455 A1 Aug. 14, 2003

(30) Foreign Application Priority Data

Feb. 12, 2002 (JP) ........................................ 2002-033565

(51) Int. Cl.[7] ................................................ H03D 3/00
(52) U.S. Cl. ...................... 329/300; 329/302; 375/324; 375/334
(58) Field of Search ................................ 329/300, 302; 375/324, 334

(56) References Cited

U.S. PATENT DOCUMENTS 5,670,951 A * 9/1997 Servilio et al. ............. 375/287
6,891,905 B1 * 5/2005 Malone et al. ............. 375/334

\* cited by examiner

Primary Examiner—Arnold Kinkead
(74) Attorney, Agent, or Firm—Flynn, Thiel, Boutell & Tanis, P.C.

(57) ABSTRACT

A circuit for detecting and correcting a center level is constituted for when the length of a code of "1" or "0" in an FSK signal is extremely long and superimposed with a frequency fluctuation of a transmitter/receiver. This circuit has sample value holding circuits exclusive to "1" and "0" of an input demodulation data signal. After a difference voltage between both sample values is once converted to a digital code in an ADA converter, the converted code is re-converted to an analog value, thereby holding the value digitally. When "1"s repeat, the hold voltage to "1" is updated to new values and simultaneously a voltage obtained by subtracting the difference voltage from the above-described voltage is applied to the holding circuit for "0" to update the value in the holding circuit. Also, when "0"s repeat, the processing proceeds in reverse and the holding circuit for "1" is updated with a voltage obtained by adding the difference voltage to the hold voltage. Thus a determination on data information is made as a reference value for a comparator utilizing a mean value between both the hold voltages as a center level value.

12 Claims, 4 Drawing Sheets

CIRCUIT FOR DETECTING AND CORRECTING CENTRAL LEVEL OF FSK DEMODULATION SIGNAL

BACKGROUND OF THE INVENTION

1. Field of the Invention

The present invention relates to improvement in a circuit configuration technique of a circuit for detecting and correcting a central level required at a time of demodulation of an FSK (Frequency Shift Keying) signal.

2. Background of the Invention

In general, a demodulated signal of an FSK signal involves an error in its center level for many causes such as an error in transmission frequency, an error in the local oscillation frequency in a receiver, a frequency error in a frequency discriminator, and a drift in a direct current circuit system. A variety of methods have, therefore, been proposed and used to detect the center level of a demodulated signal and/or to correct an error in center level . Representative examples of such methods include: (1) Two holders are arranged to hold a positive and negative peak value of binary format data of a demodulated signal, respectively, and from the mean value of outputs from the two holders, a center level is determined. (2) A dead zone circuit is arranged for a DC current to be input to a baseband-signal-processing DC current system, and a positive and negative width of a demodulated baseband signal is set to conform with a dead zone voltage width of the dead zone circuit. With the dead zone circuit arranged and set as mentioned above, no output is produced from the dead zone circuit when there is no error in center level, but when there is an error in center level, an output corresponding to the error is produced from the dead zone circuit. Accordingly, the error in the center level is determined by relying upon the magnitude of the output from the dead zone circuit. (3) A center level is determined by integrating a bit synchronizing signal, which exists at the head of a packet signal, over a 2-bit length. (4) A bit synchronizing signal is sampled twice at an interval of a bit length (1 baud/sec) to obtain sample values. (5) Developing the method (1) further, two holders are arranged to hold a positive and negative peak value of binary format data of a demodulated signal, respectively, and a further holder is arranged to hold the ½ value (shift width voltage) of the difference between the positive and negative peak values. When bit "1" or bit "0" occurs successively in the binary format data, the shift width voltage is added to the binary format data or is subtracted from the binary format data to determine the center level of the demodulated signal.

In these methods, however, there are the following drawbacks. That is, in the respective methods, since the center level is first obtained in an initial stage of signal reception start, an error of the center level can be corrected by using the center level thus obtained. However, a problem occurs thereafter. When a center level has fluctuated due to a frequency fluctuation or the like, it is impossible to follow this fluctuation in the methods (1), (3) and (4). In the method (2), when a center level has fluctuated in a state where a signal is frequently fluctuating between "1" and "0", which side of the dead zone band has overflowed can be found so that an error of a center level can be detected immediately. However, when the signal remains "1" or "0" for a long time period, detection can be made when "1" or "0" shifts in an overflowing direction from the dead zone band, but in case that the signal shifts in a reverse direction thereto, detection can not be made except that the shifting exceeds the dead zone bandwidth. In the method (5), the drawbacks found in the above-described methods can be solved, but another problem occurs. The problem also occurs in the method (1), and it is a problem due to discharging of a hold voltage inevitably caused by using an analog circuit. Therefore, the method (5) can not be applied except for a time range where an influence of the discharging can be disregarded.

In order to solve the above problem, an object of the present invention is to construct a circuit where in a demodulation of an FSK signal, not only at a time of communication start but also even in a case that "1" or "0" of the FSK demodulation signal continues for a long time, a center level can always be detected and an error, if any, can be corrected.

SUMMARY OF THE INVENTION

To solve the above-described problems, the present invention, provides a circuit for detecting and correcting a center level of an FSK demodulation signal, comprising: a first holding circuit which holds a first sample signal of a base band signal demodulated of an FSK signal by a first sampler; a second holding circuit which holds a second sample signal of the baseband signal by a second sampler; shift value calculating means for taking a difference between outputs from the first and second holding circuits to calculate a shift width value; converting means for analog-digital-analog converting the shift width value; adding means for adding an analog-converted signal of the converting means to the base band signal; subtracting means for subtracting the analog-converted signal from the base band signal; a third sampler which holds a third sample signal of the output of the adding means at the first holding circuit; a fourth sampler which holds a fourth sample signal at the second holding circuit; mean value calculating means for taking a mean of outputs of the first and second holding circuits to calculate a center level value of an FSK demodulation signal; determining means for making determination about "1" or "0" of signal reception information data of the FSK signal by utilizing the center level value as a reference value; and control means for controlling a holding function of the converting means and operations of the first to fourth samplers according to the determination result of the determination means.

Further, in another aspect of the invention, the circuit for detecting and correcting a center level of an FSK demodulation signal may be provided with means for subtracting the center level value from the baseband signal to output the same.

Furthermore, in still another aspect of the invention, the circuit for detecting and correcting a center level of an FSK demodulation signal may be provided with means for feeding back the center level value to a local oscillator for frequency conversion of an FSK demodulation circuit to control an oscillation frequency of the local oscillator.

According to the above-described construction, the holding circuits are respectively caused to hold two sample values corresponding to "1" and "0" individually, a mean value of the outputs of the holding circuits is set to a center level value and a difference voltage (corresponding to a peak-to-peak value in case of a bit synchronization signal) between the outputs of both the holding circuits is converted to a digital code, so that holding is performed with this digital code as necessary. When "1" s come sequentially, the holding circuit for "1" is successively updated with sample values of respective "1" s and voltages obtained by subtracting voltages where the digital codes have been converted to analog values. The sample values are added to the holding circuit for "0" to conduct updating to successive values. When "0"s come sequentially, the holding circuit for "1" is updated with sample values of respective "0"s, and voltages obtained by adding voltages where the digital codes have been converted to analog values to the sample values are added to the holding circuit for "1" to conduct updating of successive values. According to this operation, when "1" is being received, a voltage corresponding to "0" can be obtained together with a received voltage of "1", and when "0" is being received, a voltage corresponding to "1" can be obtained together with a received voltage of "0", so that these values are held by the respective holding circuits. Both of the holding circuits are always updated to momentary successive values (for example, at a baud speed of communication). Since a mean value of both the hold voltages obtained in this manner is a center level, this voltage is used as a reference voltage for a comparator.

Thus, even if a code where "1"s or "0"s repeat many times, and even if a center frequency is fluctuating, a correct center level value can always be obtained.

As described above, according to the present invention, in demodulation of an FSK signal, even if "1"s or "0"s of information continue sequentially many times, a shift width is stored as a digital code, so that a center level can be detected by adding or subtracting a voltage of the shift width to or from a signal voltage currently being received. Therefore, "1" or "0" can be determined by a comparator on the basis of this center level or an AFC system can be configured by feeding back the center level. In this invention, since a center level is detected by using a signal being currently received, a fluctuation of the center level can be detected and corrected irrespective of the contents of a transmission code sequence.

DETAILED DESCRIPTION OF THE PREFERRED EMBODIMENTS

One embodiment of a circuit for detecting and correcting a center or central level of an FSK demodulation circuit of the present invention will be explained below with reference to the drawings.

Figure 1:
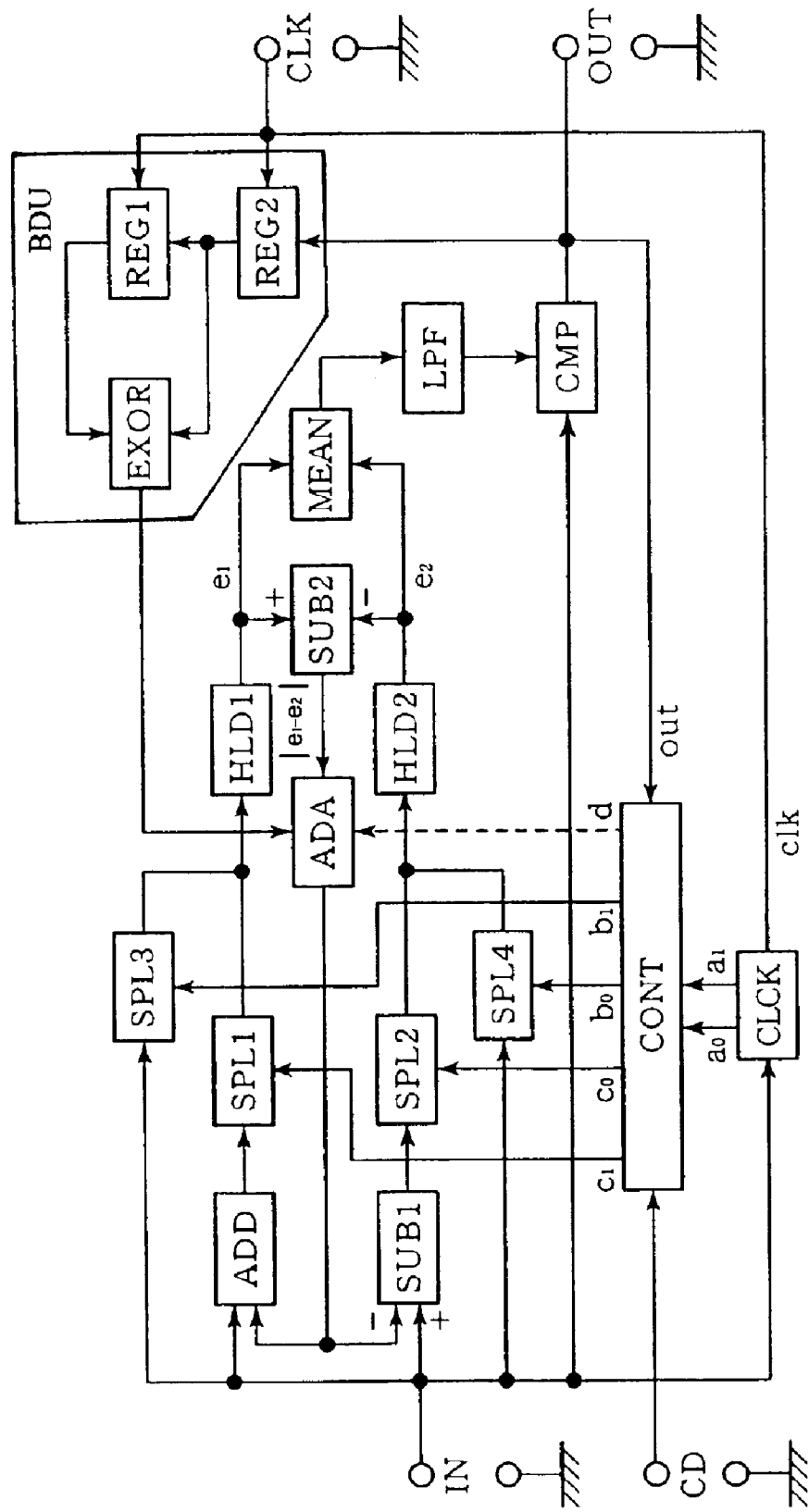
FIG. 1 is a block diagram showing a configuration of an embodiment of the present invention.

FIG. 1 is a configuration diagram of a circuit of an embodiment, and FIGS. A(A) and 2(B) are diagrams showing waveforms for explaining an operation of the circuit, where 2(A) indicates waveforms of respective portions at a time of bit synchronization signal reception of an FSK signal and 2(B) indicates waveforms of respective portions at a time of a normal data signal reception.

In FIG. 1, IN denotes an input terminal for an FSK demodulation baseband signal; CD denotes a carrier detection signal input terminal from a carrier detector of an FSK demodulation circuit; CLK denotes an output terminal for a clock signal regenerated; OUT denotes an output terminal for a FSK demodulation signal (data information) whose central level has been corrected; ADD denotes an addition circuit; SUB1, SUB2 denotes subtracting circuits; SPL1, SPL2, SPL3, SPL4 denote samplers; ADA denotes an analog-digital-analog converter; HLD1, HLD2 denote holding circuits; MEAN denotes a mean value circuit; LPF denotes a low-pass filter; CMP denotes a comparator; REG1, REG2 denote registers; EXOR denotes an exclusive OR circuit; CONT denotes a control circuit; and CLCK denotes a clock regenerating circuit.

First of all, an operation at a time of reception of a bit synchronization signal component of an FSK demodulation signal will be explained.

Figure 2:
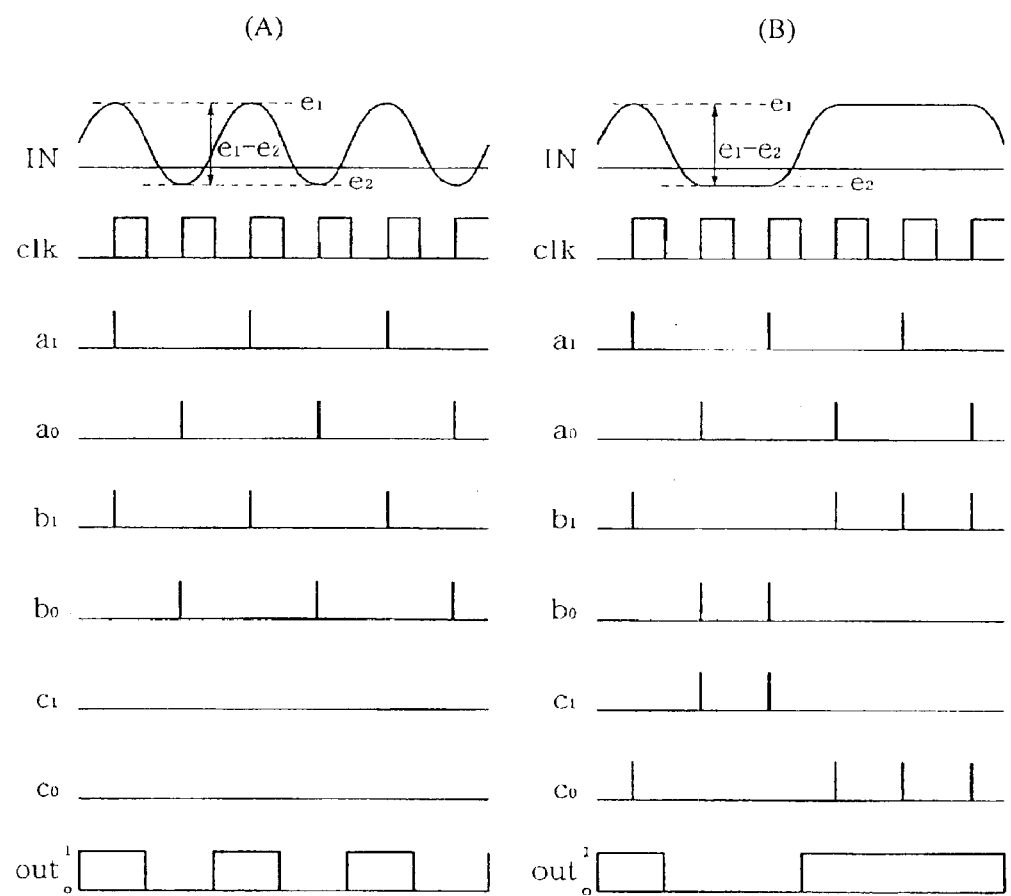
FIGS. 2(A) and 2(B) are waveforms for explaining an operation of a circuit shown in FIG. 1.

A FSK demodulation baseband signal input from the signal input terminal IN is applied to the clock regenerating circuit CLK so that clock signals are regenerated. The regenerated signals which have been regenerated in the clock regenerating circuit include three kinds of signals $a_1$, $a_0$, clk. As shown in FIG. 2(A), these clock signals are constituted such that the signal $a_1$, is generated at a sampling point (a positive peak point) of "1" of a bit synchronization signal while $a_0$ is generated at another sampling point (a negative peak point) of "0" of the bit synchronization signal, that is, $a_1$ is generated when "1" is to be sampled while $a_0$ is generated when "0" is to be sampled. In the explanation of the present embodiment, hereinafter, it is assumed that "1" of information bit is received at a positive voltage relative to "0" while "0" thereof is received at a negative voltage relative to "1". In case that this relationship is reversed, "1" should be read as "0" while "0" should be read as "1".

During reception of a bit synchronization signal, such a configuration is employed that both the clock pulses of $a_1$ and $a_0$ appear at $b_1$, $b_0$ through the control circuit CONT as they are, so that a positive peak value $e_1$ of "1" and a negative peak value $e_2$ of "0" are respectively sampled at the sampler SPL3 and the sampler SPL4, and held at the holding circuits HLD1 and HLD2. Outputs of both the holding circuits are input into the subtracting circuit SUB2 where a difference between a positive peak voltage and a negative peak voltage $e_1 - e_2$ is obtained. Since this voltage is a difference between both peak voltages, it corresponds to a value two times a shift width from a center level to both the peaks. Hereinafter, this voltage is abbreviated as a shift width voltage.

Next, after the shift width voltage is applied to the analog-digital-analog converter (hereinafter, abbreviated as ADA converter) to be once converted to a digital code, it is recovered to an analog voltage, again. The ADA has a function for making it possible to perform a complete holding of the shift width voltage by holding the shift width voltage as the digital code when the shift width voltage has once been converted to a digital code.

In case that it can be assumed that the shift width of an FSK signal does not fluctuate within a time range of about one packet, a time of a holding start is determined from a structure of a packet and a reception start time, so that the ADA converter is held by controlling conducted according to a hold instruction signal output to a control line d depicted with a dotted line extending from the control circuit CONT. Therefore, in this case, this hold is maintained until the packet is terminated.

The shift width voltage obtained in this manner is applied to the adding circuit ADD and the subtracting circuit SUB1. This is because "1" of information bit is received at a positive voltage so that, when "1" has been received, a voltage corresponding to "0" can be obtained by subtracting the shift voltage from the voltage at that time, and "0" is received at a negative voltage so that, when "0" has been received, a voltage corresponding to "1" can be obtained by adding the shift width voltage to the voltage at that time.

The voltage corresponding to "1", thus obtained is input to the sampler SPL1, while the voltage corresponding to "0" is input to the sampler SPL2. As understood from FIG. 2(A), in the samplers SPL1 and SPL2, since the sampling pulses $c_1$ and $c_0$ do not occur, sampling is not conducted.

Since outputs from the holding circuits HLD1 and HLD2 are applied to the mean value circuit MEAN, a center level value of the FSK signal can be obtained here. The center level value is input into the comparator CMP via the low-pass filter LPF where the center level value is used as a reference voltage. Thereby, the comparator CMP can make a determination about whether the reception information data of the FSK signal is "1" or "0" on the basis of the center level value of a binary signal.

Next, operation at the data signal component reception time of the FSK demodulation signal will be explained.

As mentioned above, since a shift width signal is held in the ADA converter, when "1" has been received, a voltage corresponding to "0" can be obtained at the output of the subtracting circuit SUB1, while the voltage corresponding to "1" can be obtained at the output of the adding circuit ADD when "0" has been received. Accordingly, as shown in FIG. 2(B), when "1" has been received, the signal voltage is read in at the sampling pulse $b_1$ to be held in the holding circuit HLD1 and simultaneously the voltage corresponding to "0", obtained by subtracting the shift width voltage from this signal voltage is read in at the sampling pulse co to be held in the holding circuit HLD2. On the other hand, when "0" has been received, the signal voltage is read in at a sampling pulse $b_0$ to be held at the holding circuit HLD2 and simultaneously the voltage corresponding to "1", obtained by adding the shift width voltage to this signal voltage is read in at a sampling pulse cl to be held at the holding circuit HLD1. That is, the reception voltage corresponding to "1" and the reception voltage corresponding to "0" are respectively applied and held in the holding circuits HLD1 and HLD2 for each bit of the data signal component whether the information is "1" or "0".

Since the values in the holding circuits HLD1 and HLD2 are continually updated to new values irrespective of whether the information is "1" or "0", the center level can be correctly detected even if "1"s or "0"s are successively repeated many times.

The binary signal (data information) shaped in the comparator CMP is output into the signal output terminal OUT and is applied to a two-stage shift register constituted by the registers REG1 and REG2. When an input and an output of the register REG1 are input to the exclusive OR circuit EXOR, determination can be made about whether or not sequential bits of the data information are of the same polarity. Therefore, the ADA converter is allowed to hold its digital value while bits of the same polarity are input in succession, but when a bit has a different polarity, is not allowed to hold its digital value, that is, is caused to update its digital value with a new value when a bit of the different polarity is input. Thus, even if the shift width fluctuates during communication, such a fluctuation can be dealt with so that a correct center level can always be detected. The registers REG1 and REG2 and the exclusive OR circuit EXOR make up a bit detection unit BDU.

Figure 3:
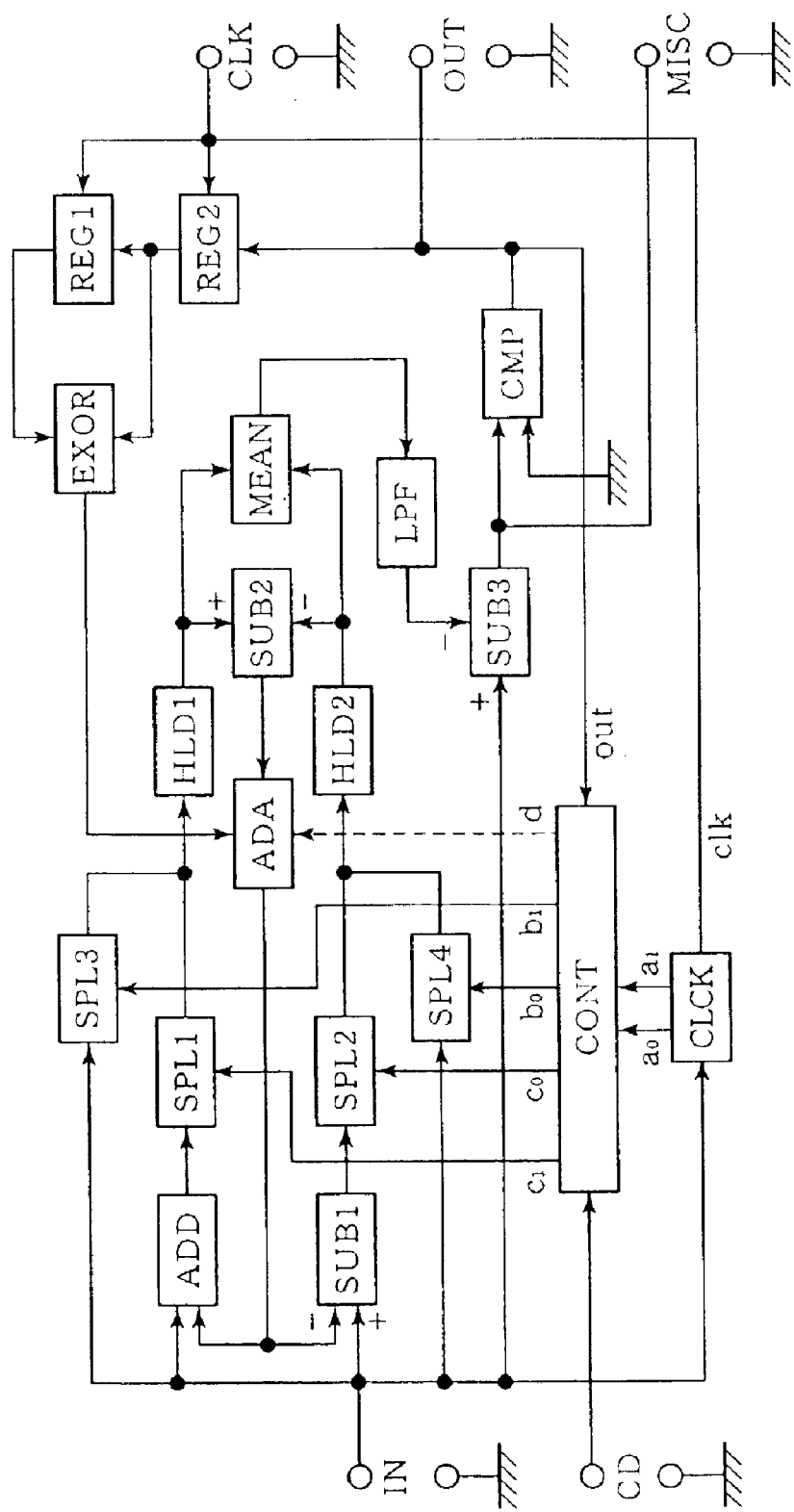
FIG. 3 is a block diagram showing another embodiment of the invention.
Figure 4:
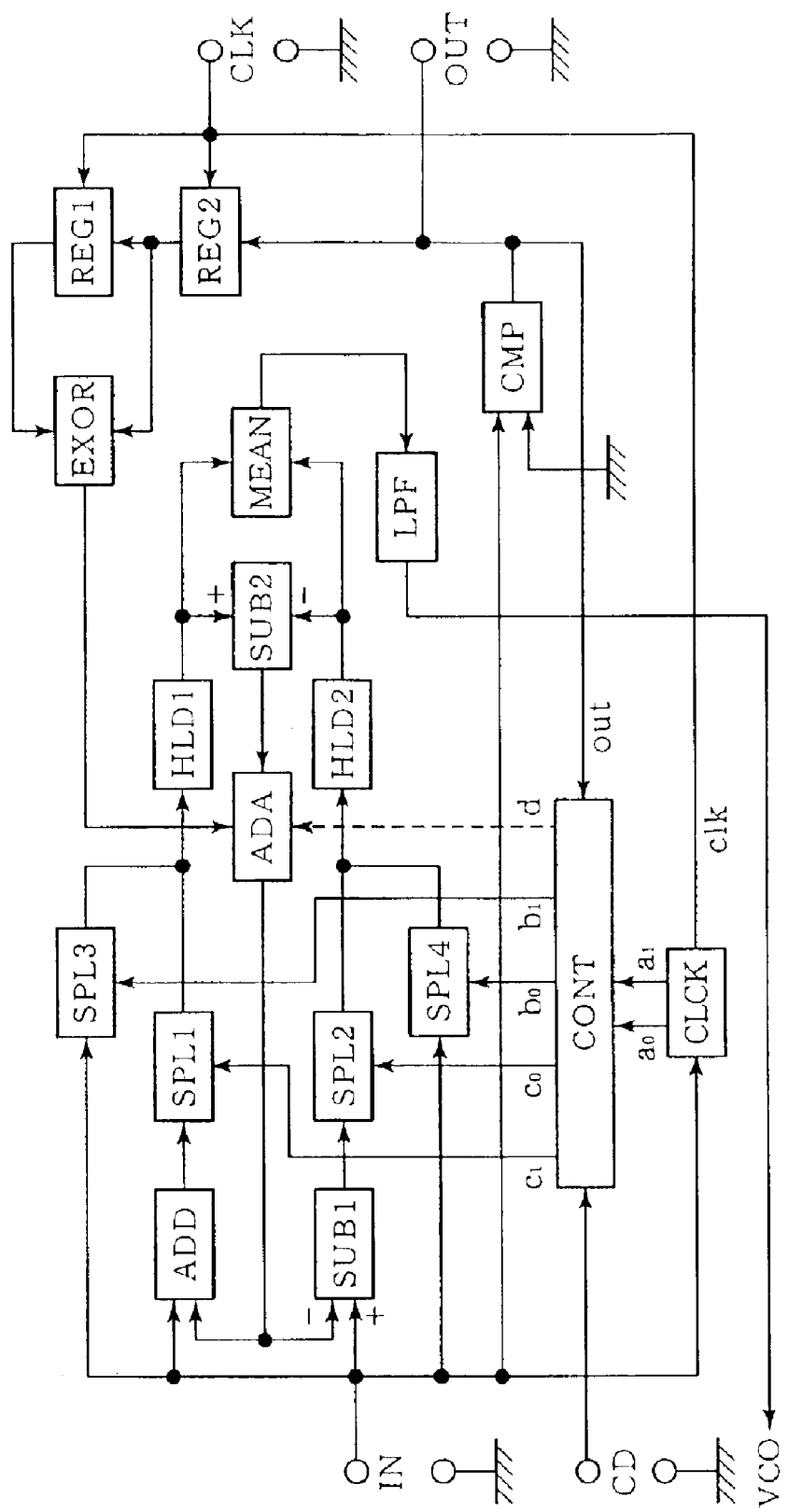
FIG. 4 is a block diagram showing still another embodiment of the invention.

In the above explanation, the method which obtains a center level value to utilize the value as a reference voltage for the comparator CMP has been described, but such a constitution shown in FIG. 3 can be employed when a baseband signal whose center error is zero is required for another different purpose. In FIG. 3, SUB3 denotes a subtracting circuit and MISC denotes an output terminal for another purpose, where a center level value is subtracted from an FSK demodulation baseband signal to be output to the output terminal MISC.

Further, in the FSK demodulation circuit, an AFC (automatic frequency control) is effected for improving an effective use and an SN ratio of an intermediate frequency amplifier or the like. In this case, such a configuration can be employed so that a signal representing a detected center level is fed back to a local oscillator for frequency conversion by a VCO (a voltage control oscillator) to control an oscillation frequency thereof.

What is claimed is:

1. A circuit for detecting and correcting a center level of an FSK demodulation signal, comprising:

first, second, third and fourth samplers; first and second holders, first and second subtractors, an ADA converter, an adder, a mean value calculation unit, a comparator and a bit detection unit;

the third sampler and the first holder for sampling and holding a positive peak value of a baseband signal obtained from said FSK demodulation signal, the fourth sampler and the second holder for sampling and holding a negative peak value of said baseband signal, the second subtractor for determining a difference in output between said first and second holders and producing a voltage (e1–e2) corresponding to a difference between said positive and negative peaks of said baseband signal, the ADA converter for subjecting said voltage (e1–e2), which corresponds to said difference between said positive and negative peaks, to analog-digital-analog conversion, said ADA converter having a digital signal holding function, the adder for adding an analog voltage, which has been output from said ADA converter, to said baseband signal such that an output from said adder is sampled by said first sampler and an output from said first sampler is held in said first holder, the first subtractor for subtracting said analog voltage from said baseband signal such that an output from said first subtractor is sampled by said second sampler and an output from said second sampler is held in said second holder, the mean value calculation unit for calculating a mean value of outputs from said first and second holders and setting said mean value as a center level for said FSK demodulation signal, the comparator for comparing said center level, which has been set by said mean value calculation unit, with binary format data of said FSK demodulation signal and outputting bit "1" or bit "0" of said binary format data on a basis of results of said comparison, the bit detection unit for feeding a detection output to said ADA converter when there are successive bits of the same polarity in binary format data output from said comparator, and the controller for controlling said first to fourth samplers, said first and second holders, said first and second subtractors, said ADA converter, said adder, said mean value calculation unit, said comparator and said bit detection unit, wherein said ADA converter retains said digital signal holding function while detection outputs are being fed from said bit detection unit.

2. The circuit according to claim 1, further comprising a third subtractor for subtracting said center level set by said mean value calculation unit from said baseband signal such that an output from said third subtractor and a reference voltage are added to said comparator, wherein based on results of said comparison, bit "1" or bit "0" of binary format data is output from said comparator.

3. The circuit according to claim 1, further comprising a frequency-converting local oscillator such that said mean value output from said mean value calculation unit is returned to said frequency-converting local oscillator to correct an oscillation frequency of said frequency-converting local oscillator by said output mean value.

4. A circuit for detecting and correcting a center level of a FSK demodulated baseband signal, said circuit comprising:

first, second, third and fourth samplers; first and second holders; first and second subtractors; an analog/digital/analog converter; an adder; a mean value unit; a comparator; a bit detection unit; a controller; a clock regenerating circuit; an input terminal and an output terminal;

said input terminal connecting to a positive input of said first substractor, said adder, said third sampler, said fourth sampler, and said clock regenerating circuit;

said first sampler and said third sampler connecting to an input of said first holder;

said second sampler and said fourth sampler connecting to an input of said second holder;

said first holder connecting to a positive input of said second subtractor and to a first input of said mean value unit;

said second holder connecting to a negative input of said second subtractor and to a second input of said mean value unit;

said second subtractor connecting to an input of said analog/digital/analog converter;

said analog/digital/analog converter connecting to a negative input of said first subtractor and connecting to an input of said adder;

said adder connecting to an input of said first sampler;

said first subtractor connecting to an input of said second sampler;

said clock regenerating circuit connecting to said controller and connecting to said bit detection unit;

said controller connecting to and controlling said first, second, third and fourth samplers and connecting to and controlling said analog/digital/analog converter; and said comparator connecting to said controller, said bit detection unit and said output terminal, wherein said first subtractor receives a FSK demodulated baseband signal and a shift width converter output from said analog/digital/analog converter, said subtractor subtracting the shift width converter output from the FSK demodulated baseband signal to provide a first subtractor output that is received by said second sampler circuit, said adder receives the FSK demodulated baseband signal and the shift width converter output, said adder adding the shift width converter output to the FSK demodulated baseband signal to provide an adder output that is received by a first sampler circuit, said controller controls said first sampler to provide an output to said first holder and controls said second sampler to provide an output to said second holder, said controller controls said third sampler and said fourth sampler which both receive the FSK demodulated baseband signal, said third sampler provides an output to said first holder and said fourth sampler provides an output to said second holder, said second subtractor receives an output value from said first holder and an output value from said second holder and subtracts the output values to provide a second subtraction output value, said analog/digital/analog converter receives said second subtraction output value and receives a bit direction unit output from said bit direction unit, and said mean value unit receives the output value from the first holder and the output value from the second holder to calculate the center level for the FSK demodulated baseband signal.

5. The circuit according to claim 4, wherein said controller receives a carrier detection signal and receives clock signals from said clock regenerating circuit.

6. The circuit according to claim 4, said bit detection unit comprising first and second registers, and an EXCLUSIVE-OR circuit, wherein said second register receives the comparator output, said second register provides an output to said first register, said EXCLUSIVE-OR circuit receives the outputs of said first and second registers and provides the bit detection unit output to said analog/digital/analog converter.

7. The circuit according to claim 4, further comprising a filter, wherein said mean value unit connects to said comparator through said filter and said input terminal is connected to said comparator to provide the FSK demodulated baseband signal thereto, and wherein said comparator receives and compares the FSK demodulated baseband signal and the center level to obtain a bit "1" or bit "0" of binary format as the comparator output, the comparator output is provided to the output terminal, to said controller and to said bit detection unit.

8. The circuit according to claim 7, said bit detection unit comprising first and second registers, and an EXCLUSIVE-OR circuit, wherein said second register receives the comparator output, said second register provides an output to said first register, said EXCLUSIVE-OR circuit receives the outputs of said first and second registers and provides the bit detection unit output to said analog/digital/analog converter.

9. The circuit according to claim 4, further comprising a filter and a third subtractor, wherein said mean value unit connects to said third subtractor through said filter so that a negative input of said third subtractor receives the center level and so that a positive input of said third subtractor receives the FSK demodulated baseband signal, said third subtractor provides an output to said comparator, and said comparator provides a bit "1" or bit "0" of binary format as the comparator output to the output terminal, to said controller and to said bit detection unit.

10. The circuit according to claim 4, said bit detection unit comprising first and second registers, and an EXCLUSIVE-OR circuit, wherein said second register receives the comparator output, said second register provides an output to said first register, said EXCLUSIVE-OR circuit receives the outputs of said first and second registers and provides the bit detection unit output to said analog/digital/analog converter.

11. The circuit according to claim 4, further comprising a filter, and a voltage controlled oscillator, wherein said mean value circuit connects to said voltage controlled oscillator through said filter, and said comparator receives said FSK demodulated baseband signal, and said comparator provides said comparator output to said output terminal, to said controller and to said bit detection unit.

12. The circuit according to claim 11, said bit detection unit comprising first and second registers, and an EXCLUSIVE-OR circuit, wherein said second register receives the comparator output, said second register provides an output to said first register, said first and second registers receive a clock signal from said clock regenerating circuit; and said EXCLUSIVE-OR circuit receives the outputs of said first and second registers and provides the bit detection unit output to said analog/digital/analog converter.

* * * * *